United States Patent [19]
Weiss et al.

[11] Patent Number: 5,526,363
[45] Date of Patent: Jun. 11, 1996

[54] MULTICONTEXT COMPRESSION SYSTEM WITH SHARED DATA STRUCTURES

[75] Inventors: Jeffrey Weiss, Smithfield, R.I.; Jeffrey Black, Wellesley; Wing Lam, Boston, both of Mass.

[73] Assignee: Telco Systems, Inc., Norwood, Mass.

[21] Appl. No.: 441,868

[22] Filed: May 16, 1995

[51] Int. Cl.⁶ .............................. H04J 3/16; H03M 7/30
[52] U.S. Cl. ............................... 370/118; 341/51; 341/87
[58] Field of Search ................................ 370/118, 79, 82, 370/83, 84, 99, 109, 94.1; 375/240; 341/51, 87; 348/385, 387

[56] References Cited

U.S. PATENT DOCUMENTS

| | | | |
|---|---|---|---|
| 3,659,052 | 4/1972 | Slavin | 370/118 |
| 4,054,951 | 10/1977 | Jackson et al. | 364/900 |
| 4,558,302 | 12/1985 | Welch | 340/347 DD |
| 4,701,745 | 10/1987 | Waterworth | 340/347 DD |
| 4,730,348 | 3/1988 | MacCrisken | 375/122 |
| 4,906,991 | 3/1990 | Fiala | 341/51 |
| 5,003,307 | 3/1991 | Whiting et al. | 341/51 |
| 5,016,009 | 5/1991 | Whiting et al. | 341/67 |
| 5,049,881 | 9/1991 | Gibson et al. | 341/95 |
| 5,051,745 | 9/1991 | Katz | 341/51 |
| 5,126,739 | 6/1992 | Whiting et al. | 341/106 |
| 5,140,321 | 8/1992 | Jung | 341/55 |
| 5,155,484 | 10/1992 | Chambers, IV | 341/55 |

FOREIGN PATENT DOCUMENTS

| | | |
|---|---|---|
| 309280 | 3/1989 | United Kingdom . |
| WOA8715178 | 8/1987 | WIPO . |
| WO92/20176 | 11/1992 | WIPO ............ H04J 3/16 |

OTHER PUBLICATIONS

Bell, Timothy C., "Text Compression", 1990, Prentice Hall, pp. 12–123.
Roesgen, Jack and Ahmed, Hassan, "Gate Array Functional Specification", Jul. 23, 1993.
Ziv, "A Universal Algorithm for Sequential Data Compression", IEEE Transactions on Information Theory, IT IT–23–3, May 1977, pp. 337–343.
D. E. Knuth, "Dynamic Huffman Coding," Journal of Algorithms, Algorithms, vol. 6, 1985, pp. 163–180.
T. A. Welch, "A Technique for High–Performance Data Compression", Computer, Jun. 1984. pp. 8–19.
D. E. Knuth, "Sorting and Searching: The Art of Computer Programming", vol. 3, 1973, pp. 117–128, 506–549.
R. G. Gallagher, "Variations on a Theme by Huffman", IEEE Transactions on Information Theory, IT–24–6, Nov. 1978, pp. 668–674.
M. Wells, The Computer Journal, vol. 15, No. 4, Nov. 1972, pp. 307–313.
J. G. Cleary and Ian H. Witten, "Data Compression Using Adaptive Coding and Partial String Matching", IEEE Transactions on Communications, vol. Com. 32, No. 4, Apr. 1984, pp. 396–402.
M. E. Gonzalez Smith and J. A. Storer, "Parallel Algorithms for Data Compression", Journal of the Association for Computing Machinery, vol. 32, No. 2, Apr. 1985, pp. 344–373.
J. H. Mommens and J. Raviv, "Coding for Data Compaction", IBM Research No. 11, Nov. 1974.
D. A. Hoffman, "A Method for the Construction of Minimum–Redundancy Codes", Proceedings of the I.R.E., Sep. 1952, pp. 1098–1101.
Mark Nelson, "The Data Compression Handbook", M&T Publishing, 1991.

*Primary Examiner*—Douglas W. Olms
*Assistant Examiner*—Matthew C. Phillips
*Attorney, Agent, or Firm*—Wolf, Greenfield & Sacks

[57] ABSTRACT

A system for transmitting compressed data for multiple channels or contexts from a single node which system reduces memory utilization without significant adverse effect on compression ratio by providing a separate history buffer for each channel, with a single hash table being provided for generating potential match addresses in the history buffer for at least selected ones of the channels. A single chain table may also be provided, the chain table having a single offset address for the corresponding offset addresses in the buffers for the selected channels. Collisions in the common hash table may be reduced by including channel address or the like as an additional input to the hash table, thereby biasing the address outputs therefrom.

6 Claims, 2 Drawing Sheets

MULTICONTEXT COMPRESSION SYSTEM WITH SHARED DATA STRUCTURES

FIELD OF THE INVENTION

This invention relates to compression systems for transmitted data and more particularly to a multicontext system of this type with shared data structures to reduce storage requirements.

BACKGROUND OF THE INVENTION

String search algorithms are frequently employed for performing compression in data transmission systems. These algorithms, such as the various Lempel Ziv 77 algorithms, normally utilize a historical buffer containing a window of selected length of prior transmitted data against which incoming data is compared to find matches. The incoming data is then encoded as offsets and lengths based on such matches to achieve the desired compression. To facilitate the matching operation, hash tables are generally employed to identify a first potential match in the historical buffer and chain tables are frequently employed to identify additional potential matches.

Heretofore, in multichannel/multicontext environments (i.e. where a single node outputs different types of data to different receiving nodes with frames or packets of data for the different channels being interleaved) either completely separate data structures (i.e. a separate historical buffer, separate hash table and separate chain table) have been provided for each channel, or at least the history buffer portion of any shared data structure has been reset at the beginning of each frame. The first solution is disadvantageous in that it requires large amounts of memory. Since the various data structures must respond rapidly to assure that the compression operation does not adversely affect the data rate of the system, the memory used is expensive, high speed memory. Reducing memory requirements can therefore result in significant savings.

Resetting shared data structures after each frame, or at a minimum at the end of the last frame for a given data channel before transmission is switched to another channel, results in a need to build a new data structure, including a new history buffer, for each such frame. Since the more data there is in the history buffer, the higher the compression ratio which can be achieved, the frequent resetting of the various data structures, and in particular the resetting of the history buffer, results in significantly reduced average compression ratio for the systems.

It would therefore be desirable if memory requirements in a multichannel compression system could be reduced by sharing certain data structures, such as hash tables and chain tables, without the substantial loss in compression ratio caused by the resetting of data structures, and in particular history buffers, at frame or channel transitions.

SUMMARY OF THE INVENTION

In accordance with the above, this invention provides a system for transmitting compressed data for multiple channels or contexts from a single node, which system reduces memory utilization by sharing at least some data resources while minimizing the adverse effects on compression ratio resulting from such sharing. In particular, a separate history buffer is provided for each channel or context, with a single hash table being provided for generating potential match addresses in the history buffers for at least selected ones of the channels. Where the number of channels is more than can be served from a single hash table/chain table without excessive collisions, two or more shared tables may be provided, with each shared table serving selected channels. Rather than being reset at each frame or channel transition, address entries in the hash table for one context are overwritten with address entries for a succeeding context when collisions occur in the hash table. A single chain table may also be provided, the chain table having a single offset address for the corresponding offset addresses in the buffers for the selected channels. Address entries for one context in the chain table are also overwritten with chain address entries for a succeeding context when collisions occur in the chain table.

Since the overwriting indicated above will result in some searches for a given context being performed at invalid addresses, the depth of searches in the chain table is limited so as to reduce the processing penalty caused by such invalid searches. The likelihood of collisions occurring in the hash table, and thus the likelihood of a search being attempted at an invalid entry, is reduced by having a hashing element or circuit for generating addresses in the single hash table, which element receives as inputs both the data for the channel or context currently being transmitted and an input indicative of the channel or context for the given input. The hashing element is responsive to the input indicative of context for generating a different hash table address for each context for at least selected input character combinations. Thus, by statistical selection of these biased entries, the likelihood of collisions occurring in the hash table can be significantly reduced.

The foregoing and other objects, features and advantages of the invention will be apparent from the following more particular description of preferred embodiments of the invention as illustrated in the accompanying drawings.

IN THE DRAWINGS

DETAILED DESCRIPTION

Figure 1:
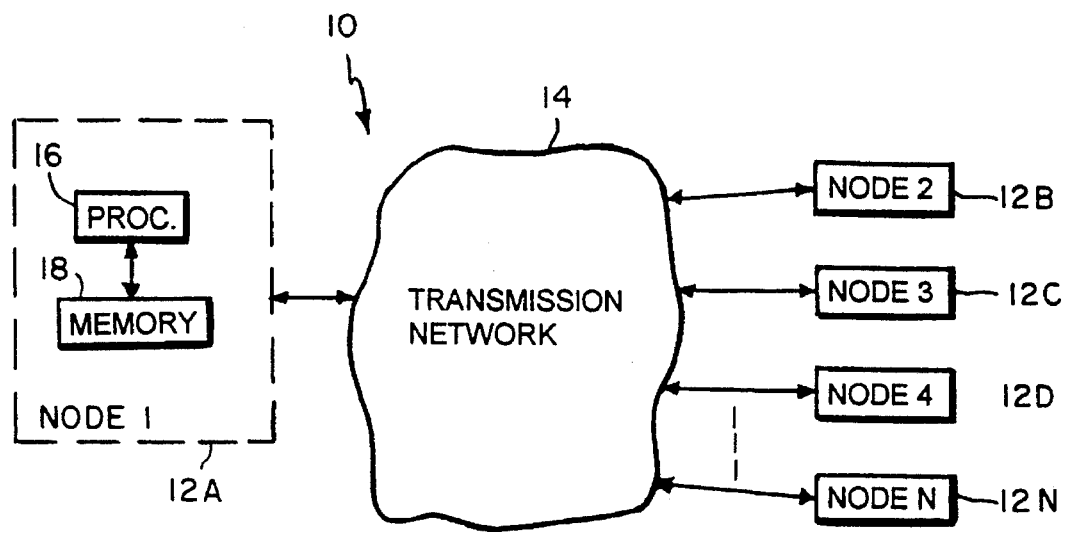
FIG. 1 is a block diagram of an exemplary system in which the teachings of this invention may be employed.

FIG. 1 illustrates a data transmission system of the type in which the teachings of this invention might be utilized. The system has a plurality of nodes 12A–12N which communicate with each other through a data transmission network 14. Data transmission network 14 may, for example, be a telephony network which may include copper and/or fiber optic wires, cables, microwave or radio transmissions, or the like, with the data, depending on the length of the virtual channel between nodes, also being adapted to pass through various end stations, central stations and other intermediate nodes in completing a virtual channel. Further, particularly where the nodes being connected by a virtual channel are separated by a substantial distance, there may be an almost infinite number of ways in which the channel interconnecting the two nodes may be formed. However, the nature of the network 14 is such that, as for most telephone systems, any node on the system may communicate with just about any other node on the system. Further, each node may be simultaneously sending messages, which messages may use substantially different vocabularies, to two or more nodes through multiple channels, with the messages for the various nodes being interleaved at the output from the node.

For purposes of illustration, each node 12 is shown as including a processor 16 and a memory 18 (only the processor and memory for node 1 being shown in the figure). Each node may also include substantial additional circuitry for performing various functions, which circuitry and functions will depend on application and environment. The processor 16 for this embodiment performs, among other functions, the function of data compression for the data being transmitted from the node, it being assumed that the data compression algorithm utilized employs string search algorithms so as to require history buffers and at least a hash table. Various Lempel-Ziv 77 algorithms are example of such string search algorithms.

As has been indicated earlier, in the prior art memory 18 has either had a separate history buffer, hash table and, where employed, chain table for each active channel or has used a single shared history buffer for a selected number of channels, with at least a hash table, and generally a chain table as well, also being shared for the same selected channels. These approaches can be combined with some channels having dedicated buffers et al. (i.e. contexts) while other channels share one or more contexts. Limitations for these approaches have been discussed earlier. In particular, they require a trade-off between a requirement for significant, expensive memory and substantial loss of compression ratio.

Figure 2A:
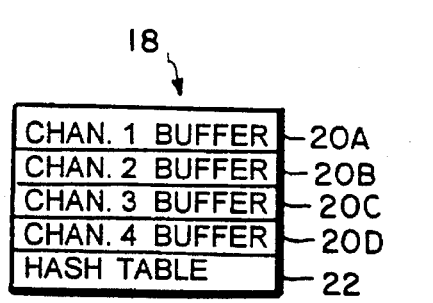
FIGS. 2A, 2B and 2C are diagrams of memory allocation for three different embodiments of the invention.
Figure 2B:
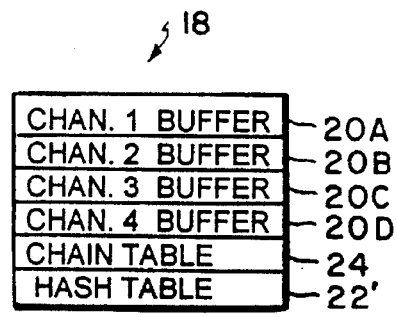
Figure 2C:
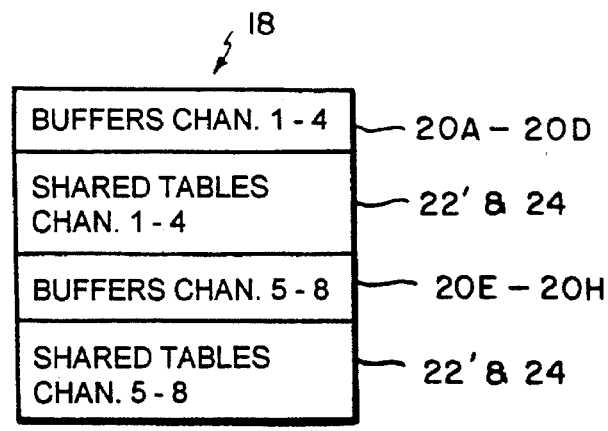

A memory 18 in accordance with the invention having a shared hash table is shown in FIG. 2A. This memory has a separate history buffer 20A–20D for each of four channels to which the node 12 is transmitting. For an illustrative embodiment, each of the buffers contains 8K bytes of eight bits each. A shared hash table 22 is also provided which for an illustrative embodiment may contain 32K eight-bit bytes, the memory 18 thus being a 64K byte memory. FIG. 2B illustrates the memory 18 for an alternative embodiment of the invention which also contains a shared chain table 24. For this embodiment of the invention, the four 8K byte history buffers 20A–20D are also provided, with hash table 22' being reduced to 16K bytes and chain table 24 being the same size. Thus, the memory 18 in FIG. 2B is also 64K bytes for the illustrative embodiment. FIG. 2C shows another embodiment of the invention where eight channels are serviced by two sets of tables, with one set of tables servicing channels A–D and the other set of tables services channels E–H. With all data structures being the same size as for the FIG. 2B embodiment, memory 18 for FIG. 2C would be 128K bytes. However, the memory size and the allocation of bytes to the various data resources within the memory for each of the embodiments are for purposes of illustration only and can vary substantially depending on the application and environment in which the system is used. Further, dedicated data resources may be provided for one or more channels in addition to the shared resources shown, and procedures may be provided for reallocating channels between shared resources and/or dedicated resources.

Figure 3:
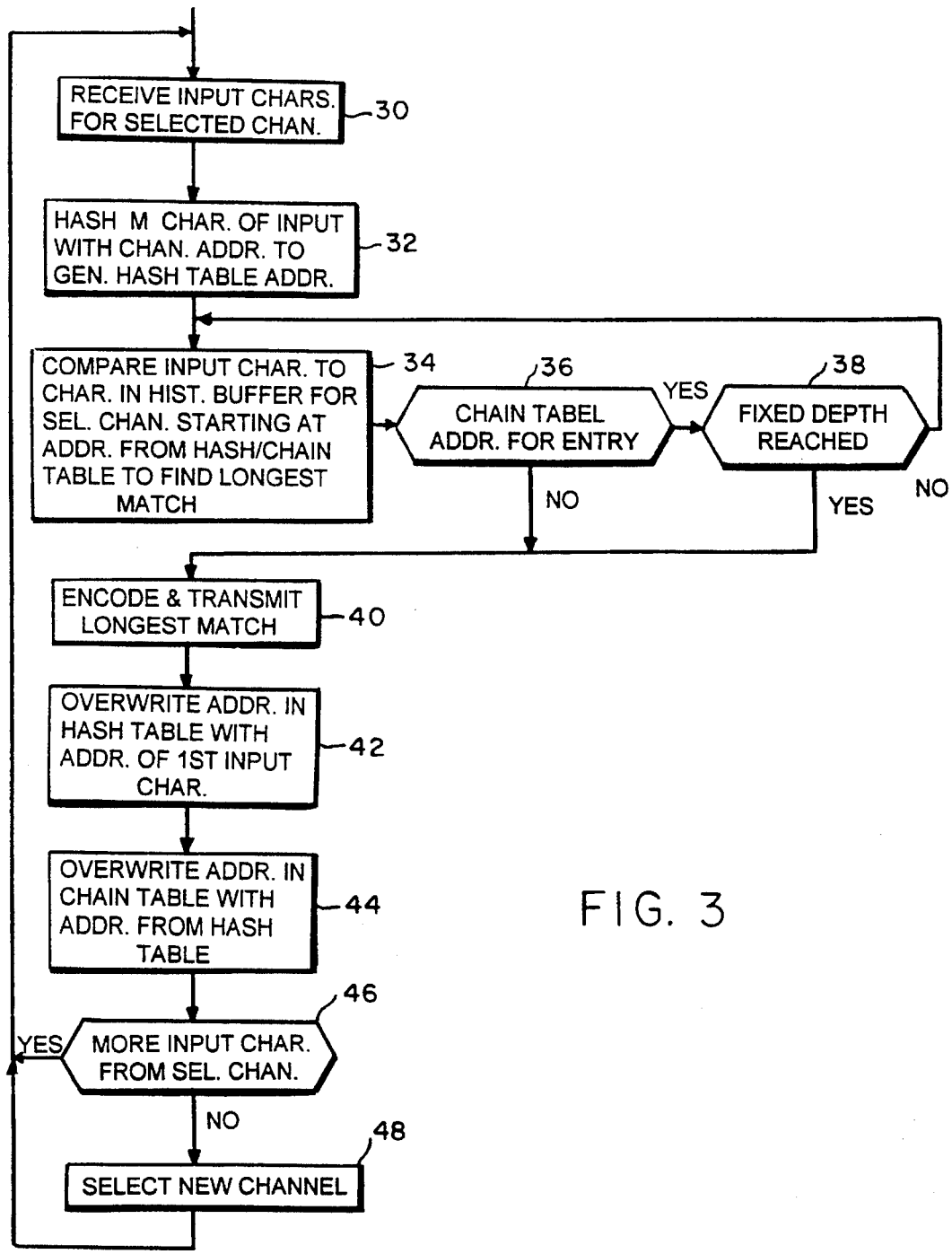
FIG. 3 is a flow diagram of a method for transmitting multichannel, multicontext data frames in accordance with the teachings of this invention.

Referring to FIG. 3, in operation input characters for a selected channel are initially either received or generated at a node, for example node 1, during step 30. M characters of this input are then hashed along with the channel address or some other suitable indication of the channel in a suitable hash generator to generate a hash table address (step 32). For a preferred embodiment, M is three. Since the hashing is not only on the input characters, but also involves the channel address, the result of the hash step may be a different location in the hash table for the same character string for each of the channels. This means that common three letter combinations such as the letters "THE" or "ING" may be hashed to different addresses in the hash table for each channel to minimize the occurrence of collisions in the hash table for the varying channels. Thus, by selecting the letter combinations hashed to the same hash table address from the various channels so that a common letter combination such as "THE" for one channel is hashed to the same address as rarely occurring letter combinations from other channels, the incidence of collisions in the hash table can be kept low enough so as to minimize the adverse effect which such collisions would otherwise have on system throughput and, more important, on compression ratios achieved from the system. The biasing may be accomplished statistically, empirically, or by some combination of the two.

During step 34, the input characters are compared to characters in the history buffer for the selected channel, starting at the address from the hash table, to find the longest match. This is a standard procedure in Lempel-Ziv 77 algorithms for data compression and is performed in standard fashion.

Once step 34 has been completed, either resulting in a longest match being found, or in no match being found, the operation proceeds to step 36 to determine if there is a chain table address for the entry. If only a hash table is provided as for FIG. 2A, step 36 might not be performed, or if performed, would always yield a "NO" output. If there is a chain table address in chain table 24 for the entry, the operation proceeds to step 38 to determine if a fixed depth for chain searching has been reached. Fixed depth chain searches are frequently employed in the art and are of particular value in this application since, notwithstanding the biasing of the hash table entries, collisions in the hash table and/or chain table are still possible, so that an address obtained from the common hash table or common chain table may not be a valid address at which a possible match might occur in its channel history buffer for the given input. Under these circumstances, to minimize processing overhead, it is desirable that excess processing not be performed, and limiting the depth of search in the chain table is one way of controlling the amount of processing performed. The penalty for limiting the depth of chain searches is a slight decrease in compression ratios; however, since maximum length matches generally occur early in the chain, this decrease is normally not significant. Further, while the occurrence of collisions results in a modest decrease in compression ratios from what can be achieved with individual hash tables and chain tables for each channel, the compression ratios achieved are significantly better than those achieved with common history buffer. The reason for this is that, particularly with the biasing of the hash table addresses, the number of collisions is not that great, so that many of the hash table entries encountered by a new channel will be valid entries and any invalid, collision-altered entries are corrected to valid entries the first time they are used.

If during step 38 it is determined that the fixed depth search has not been reached, then search step 34 is repeated, starting at the address indicated by the chain table, and steps 36 and 38 are repeated for successive chain entries until either a "NO" output is obtained during step 36 or a "YES" output is obtained during step 38. When one of these events occurs, the longest match found during the search is encoded in standard fashion, generally as an offset and length, and is transmitted through the virtual channel to the receiving node (step 40). It is noted that only a history buffer is required at the receiving node since the coded message indicates the offset address position where the longest match occurred and neither a common hash table nor a common chain table are required to search for this address. Therefore, the teachings of this invention are employed only at a transmitting node.

The address in the common hash table 22 is then overwritten during step 42 with the address at which the first input character matched on is stored in history buffer 20 for the selected channel and, during step 44, the chain table entry at the address which corresponds to the address written in the hash table is overwritten with the address which was previously in the hash table. As indicated above, to the extent a conflict had previously occurred, so that the hash and chain table entries were invalid entries, steps 42 and 44 result in these entries now being valid entries for the selected channel through which messages are now being sent.

From step 44, the operation proceeds to step 46 to determine if there are more input characters from the selected channel. If a "YES" output is obtained during step 46, the operation returns to step 30 to receive the additional input characters for the selected channel and steps 32–46 are repeated with the new input characters to, if possible, match on and encode such characters. This sequence of operations is repeated for successive input characters for the selected channel until, during step 46, a "NO" output is obtained. When this occurs, the operation proceeds to step 48 to select a new transmission channel and the operation then returns to step 30 to start receiving input characters for this new channel. No housekeeping operations on the hash and chain tables are required at this time, with any collisions which may have occurred in the common hash and chain tables for the new selected channel since the last transmission for this channel being dealt with in the manner previously discussed. More important, the dedicated history buffer 20 for the channel is not reset at this time so that an extended history is available to match on the next time the channel is used. Where there are multiple shared tables, as for the embodiment of FIG. 2C, steps such as steps 32 and 36 which involve the table would be performed in the appropriate shared tables 22', 24 for the given channel.

A system is thus described which significantly reduces memory requirements in string search data compression applications with virtually no increase in overhead operations and with only a modest decrease in system compression ratios. While the system has been described above with reference to preferred embodiments, which embodiments are assumed to be implemented in software on a general purpose processor at the transmitting node, the invention could also be practiced using special purpose hardware or a selected combination of hardware and software. Further, while specific implementations have been discussed above, the exact procedure will vary with the compression algorithm being utilized and with other factors. Thus, while the invention has been particularly shown and described above with reference to preferred embodiments, the foregoing and other changes in form and detail may be made therein by one skilled in the art without departing from the spirit and scope of the invention.

What is claimed is:

1. In a system for transmitting compressed data for multiple contexts from a single node, apparatus for facilitating reduced memory utilization comprising:

a history buffer for each of said contexts; and a single hash table for generating potential match addresses in the history buffers for at least selected ones of the contexts, the hash table including means for overwriting address entries for one context in the hash table with address entries for a succeeding context when collisions occur in the hash table.

2. Apparatus as claimed in claim 1 including a single chain table having a single address location for the corresponding address location in all of the buffers for said at least selected ones of the contexts, the chain table including means for overwriting chain address entries for one context with chain address entries for a succeeding context when collisions occur in the chain table.

3. Apparatus as claimed in claim 2 including means for limiting the depth of searches in the chain table.

4. Apparatus as claimed in claim 2 wherein there are a plurality of hash tables and a like plurality of chain tables, with each hash table and chain table pair servicing a selected plurality of said history buffers.

5. Apparatus as claimed in claim 1 including a hashing element for generating addresses in said single hash table for inputs from all of said contexts, said hashing element also receiving an input indicative of the context for a given input, and including means responsive to the input indicative of context for generating different hash table addresses for each context for at least selected input character combinations.

6. Apparatus as claimed in claim 1 wherein there are a plurality of hash tables, with each hash table servicing a selected plurality of said history buffers.

* * * * *